(12) United States Patent
Fueldner et al.

(10) Patent No.: US 11,889,283 B2
(45) Date of Patent: Jan. 30, 2024

(54) TRIPLE-MEMBRANE MEMS DEVICE

(71) Applicant: Infineon Technologies AG, Neubiberg (DE)

(72) Inventors: Marc Fueldner, Neubiberg (DE); Andreas Wiesbauer, Poertschach (AT); Athanasios Kollias, Munich (DE)

(73) Assignee: Infineon Technologies AG, Neubiberg (DE)

( * ) Notice: Subject to any disclaimer, the term of this patent is extended or adjusted under 35 U.S.C. 154(b) by 459 days.

(21) Appl. No.: 17/128,587

(22) Filed: Dec. 21, 2020

(65) Prior Publication Data
US 2022/0201398 A1    Jun. 23, 2022

(51) Int. Cl.
*H04R 7/08* (2006.01)
*B81B 3/00* (2006.01)
*H04R 7/16* (2006.01)
*H04R 19/04* (2006.01)

(52) U.S. Cl.
CPC ............. *H04R 7/08* (2013.01); *B81B 3/0021* (2013.01); *H04R 7/16* (2013.01); *H04R 19/04* (2013.01); *B81B 2201/0257* (2013.01); *B81B 2203/0127* (2013.01); *B81B 2203/0353* (2013.01); *B81B 2203/04* (2013.01); *H04R 2201/003* (2013.01)

(58) Field of Classification Search
CPC . H04R 7/08; H04R 7/16; H04R 19/04; H04R 2201/003; B81B 3/0021; B81B 2201/0257; B81B 2203/0127; B81B 2203/0353; B81B 2203/04
USPC ........................................................ 381/174
See application file for complete search history.

(56) References Cited

U.S. PATENT DOCUMENTS

| 6,075,867 | A  | 6/2000  | Bay et al. |
|-----------|----|---------|-----------|
| 9,181,080 | B2 | 11/2015 | Dehe et al. |
| 9,438,979 | B2 | 9/2016  | Dehe |
| 9,828,237 | B2 | 11/2017 | Walther et al. |
| 9,986,344 | B2 | 5/2018  | Dehe et al. |
| 10,189,699 | B2 | 1/2019 | Walther et al. |
| 2015/0001647 | A1 | 1/2015 | Dehe et al. |
| 2017/0230757 | A1 | 8/2017 | Kuntzman et al. |
| 2017/0260040 | A1 | 9/2017 | Walther et al. |
| 2018/0091906 | A1 | 3/2018 | Khenkin et al. |
| 2018/0255402 | A1 | 9/2018 | Dehe |
| 2019/0039884 | A1 | 2/2019 | Dehe et al. |

*Primary Examiner* — Sean H Nguyen
(74) *Attorney, Agent, or Firm* — Slater Matsil, LLP

(57) ABSTRACT

A system includes a first membrane, a second membrane and a third membrane spaced apart from one another, wherein the second membrane is between the first membrane and the third membrane, and the second membrane comprises a plurality of openings, a sealed low pressure chamber between the first membrane and the third membrane, and a plurality of electrodes in the sealed low pressure chamber.

20 Claims, 9 Drawing Sheets

_US 11,889,283 B2_

TRIPLE-MEMBRANE MEMS DEVICE

TECHNICAL FIELD

The present invention relates generally to a triple-membrane MEMS device.

BACKGROUND

A microphone is an acoustic sensor converting an acoustic pressure wave to an analog signal. The microphone includes a microelectromechanical system (MEMS) sensor and an application specific integrated circuit (ASIC). The MEMS sensor and the ASIC are disposed in a single package. The MEMS sensor and the ASIC are connected together through suitable electrical connections.

The MEMS sensor functions as a variable capacitor having a fixed plate and a movable plate. The movable plate is also known as a membrane. When an acoustic pressure wave is applied to the MEMS sensor, the membrane is able to move in response to the acoustic pressure wave. The movement of the membrane relative to the fixed plate varies the distance between the membrane and the fixed plate of the variable capacitor, which in turn varies the capacitance of the variable capacitor. The variation of the capacitance is determined by various parameters of the acoustic pressure wave such as sound pressure levels of the acoustic pressure wave. The variation of the capacitance of the MEMS sensor is converted into an analog signal, which is fed into the ASIC for further processing.

As semiconductor technologies further advance, a sealed dual-membrane MEMS silicon microphone has emerged to further improve key performance characteristics such as low noise and reliability. The sealed dual-membrane MEMS silicon microphone typically includes a top membrane, a bottom membrane, a perforated stator, a top isolation layer between the peripheral portions of the top membrane and the stator, a bottom isolation layer between the peripheral portions of the bottom membrane and the stator, and at least one pillar coupled between the top membrane and the bottom membrane.

The sealed dual-membrane MEMS silicon microphone is good for reducing noise. But there is still ASIC noise. More capacity is necessary to further reduce the ASIC noise. There is a need to increase the capacity of the MEMS silicon microphone so as to meet the requirements of the ever-changing MEMS microphone.

SUMMARY

In accordance with an embodiment, an MEMS apparatus comprises a first membrane, a second membrane and a third membrane spaced apart from one another, wherein the second membrane is between the first membrane and the third membrane, a first low pressure region between the first membrane and the second membrane, a second low pressure region between the second membrane and third second membrane, a first stator in the first low pressure region, and a second stator in the second low pressure region.

In accordance with another embodiment, a triple-membrane MEMS device comprises a first membrane, a second membrane and a third membrane spaced apart from one another, wherein the second membrane is between the first membrane and the third membrane, and the second membrane comprises a plurality of openings, a sealed low pressure chamber between the first membrane and the third membrane, and a plurality of electrodes in the sealed low pressure chamber.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a triple-membrane MEMS microphone. The present disclosure may also be applied, however, to a variety of MEMS devices. Hereinafter, various embodiments will be explained in detail with reference to the accompanying drawings.

Figure 1:
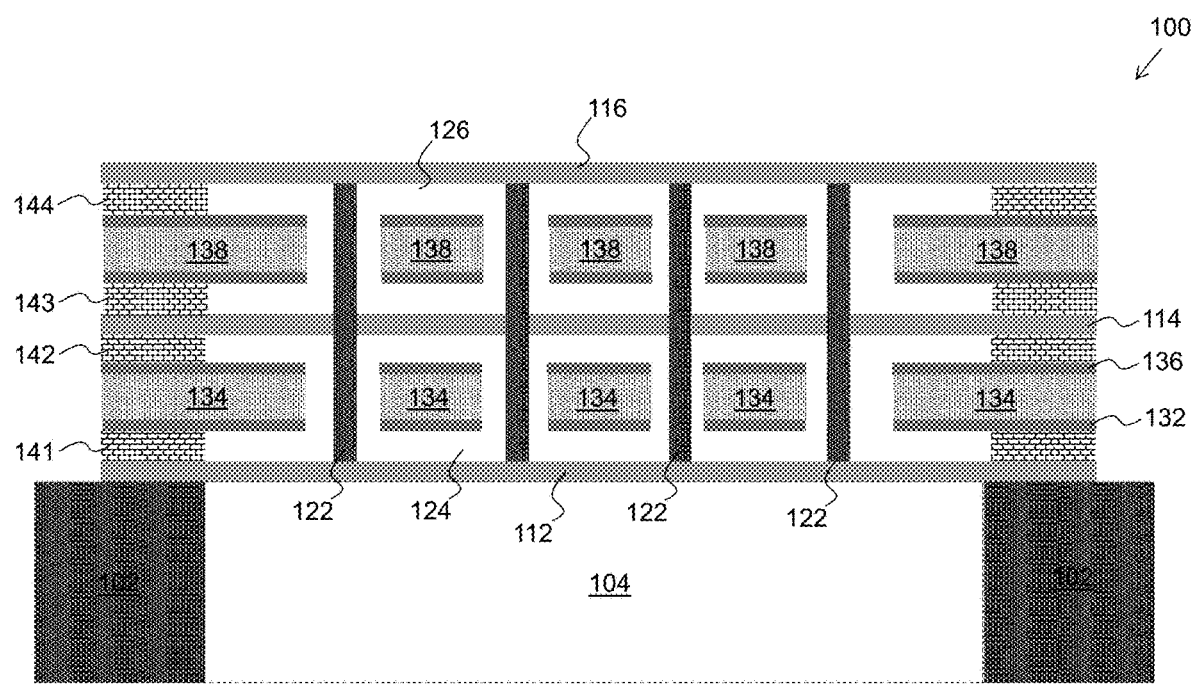
FIG. 1 illustrates a cross sectional view of a first implementation of the triple-membrane MEMS microphone in accordance with various embodiments of the present disclosure.

FIG. 1 illustrates a cross sectional view of a first implementation of the triple-membrane MEMS microphone in accordance with various embodiments of the present disclosure. The triple-membrane MEMS microphone 100 comprises a first membrane 112, a second membrane 114 and a third membrane 116 spaced apart from one another. As shown in FIG. 1, the second membrane 114 is between the first membrane 112 and the third membrane 116. In some embodiments, the first membrane 112, the second membrane 114 and the third membrane 116 may be formed of conductive materials. Furthermore, the first membrane 112, the second membrane 114 and the third membrane 116 are movable membranes.

The triple-membrane MEMS microphone 100 further comprise a first low pressure region 124, a second low pressure region 126, a plurality of pillars 122 and a plurality of first stators 134 and a plurality of second stators 138. As shown in FIG. 1, the first low pressure region 124 is between the first membrane 112 and the second membrane 114. The second low pressure region 126 is between the second membrane 114 and third second membrane 116. The plurality of first stators 134 is in the first low pressure region 124. The plurality of second stators 138 is in the second low pressure region 126. It should be noted that the plurality of first stators 134 shown in FIG. 1 may be from a single stator plane having a plurality of openings. As such, the plurality of first stators 134 may be alternatively referred to as a first stator 134. Likewise, the plurality of second stators 138 shown in FIG. 1 may be from another single stator plane having a plurality of openings. As such, the plurality of second stators 138 may be alternatively referred to as a second stator 138.

The triple-membrane MEMS microphone wo is formed over a support substrate 102. As shown in FIG. 1, the peripheral portions of the first membrane 112 are on the support substrate 102. A backside cavity 104 may be formed in the support substrate 102. The backside cavity 104 is employed to allow the first membrane 112 to oscillate in response to a sound wave. According to various embodiments, the backside cavity 104 may formed in the support substrate 102 through various etching techniques such as isotropic gas phase etching, vapor etching, wet etching, isotropic dry etching, plasma etching, any combinations thereof and the like.

In some embodiments, the support substrate 102 may be a silicon substrate. Alternatively, the support substrate 102 may be formed of any suitable semiconductor materials. For example, the support substrate 102 may be formed of semiconductor materials such as germanium, silicon germanium, silicon carbide, gallium nitride, indium, indium gallium nitride, indium gallium arsenide, indium gallium zinc oxide, any combinations thereof and the like. Furthermore, the support substrate 102 may be formed of suitable compound semiconductor materials such as III-V compound semiconductor materials and/or II-VI compound semiconductor materials.

As shown in FIG. 1, the first membrane 112 and the third membrane 116 form a chamber. In some embodiments, the chamber is a sealed chamber. The chamber includes the first low pressure region 124 and the second low pressure region 126. The pressure inside the chamber is lower than the pressure outside the chamber. In other words, the first low pressure region and the second low pressure region have a pressure less than an outer pressure. In some embodiments, the outer pressure is a pressure outside the membranes (outside the chamber). The outer pressure is equal to an atmospheric pressure or an ambient pressure.

In some embodiments, the pressure inside the chamber may be a vacuum. In some embodiments, the pressure in the first low pressure region 124 may be different from that of the second low pressure region 126. In alternative embodiments, the second membrane 114 may have a plurality of openings. As a result of having the plurality of openings in the second membrane 114, the pressure in the first low pressure region 124 is equal to the pressure of the second low pressure region 126.

As shown in FIG. 1, each stator (e.g., first stator 134) may comprise a first counter electrode element 132 and a second counter electrode element 136. The second counter electrode element 136 may be spaced apart from the first counter electrode element 132. More particularly, a counter electrode isolating layer is formed between the first counter electrode element 132 and the second counter electrode element 136. In some embodiments, the counter electrode isolating layer may be formed of suitable dielectric materials such as a silicon oxide, a silicon nitride and the like.

In some embodiments, the first counter electrode element 132 and the second counter electrode element 136 may be formed of various metals such as copper, aluminum, silver, nickel, and various suitable alloys. Alternatively, the first counter electrode element 132 and the second counter electrode element 136 may be formed of various semiconductor materials which may be doped such that they are electrically conductive (e.g., a polysilicon layer heavily doped with boron, phosphorus, or arsenic).

As shown in FIG. 1, the first stator 134 is at least partially arranged in the first low pressure region 124 or extends in the first low pressure region 124. Likewise, the second stator 138 is at least partially arranged in the second low pressure region 126 or extends in the second low pressure region 126.

FIG. 1 shows some portions of the stators may be supported at its periphery or circumference by a support structure (e.g., membrane isolation layers 141-144). FIG. 1 also shows some portions of the stators appear to be "floating" within the low pressure regions 124 and 126. It should be noted that the "floating" portions of the stators may be typically attached to the circumference of the stators.

The plurality of pillars 122 extends between the first membrane 112 and the third membrane 116. More particularly, a first terminal of each pillar extends through the first membrane 112. A second terminal of each pillar extends through the third membrane 116. In some embodiments, one or more pillars are electrically conductive. The conductive pillar provides a mechanical and electrical coupling between at least two membranes. In alternative embodiments, the pillars are electrically insulating. The non-conductive pillars provide a mechanical coupling between at least two membranes.

The plurality of pillars 122 is mechanically coupled to the first membrane 112, the second membrane 114 and the third membrane 116. As shown in FIG. 1, the pillars 122 typically do not contact or touch the first stator 134 and the second stator 138. The pillars 122 may pass through the stators 134 and 138 through openings or holes in the stators 134 and 138.

In the process of fabricating the triple-membrane MEMS microphone 100, the pillars 122 may be integrally formed with the first membrane 112, the second membrane 114 and the third membrane 116. Hence, the first membrane 112, the second membrane 114, the third membrane 116, and the pillars 122 may form an integral structure of the same material such as polycrystalline silicon and the like. Alternatively, the membranes 112, 114, 116 and the pillars 122 may be formed of different materials. For example, the first membrane 112 may be formed first on a surface of the support substrate 102 during a first deposition process. Subsequently, the pillars 122 and eventually also the other membranes 114 and 116 may be formed during subsequent deposition processes. In some embodiments, the pillars 122, which ensure a mechanical coupling among the membranes, do not provide an electrical connection between the two membranes. The pillars 122 can be made of an insulating material, like silicon, nitride, silicon oxide, a polymer or a combination of the former materials, or a combination of the former material.

The support structure of the triple-membrane MEMS microphone wo may have a stacked configuration. The support structure of the triple-membrane MEMS microphone 100 includes the support substrate 102, a first membrane isolation layer 141, a second membrane isolation layer 142, a third membrane isolation layer 143 and a fourth membrane isolation layer 144. In some embodiments, the peripheral portions of the membranes 112, 114 and 116, and the stators 134, 138 may be in contact with the support structure as shown in FIG. 1. In particular, FIG. 1 shows the various membrane isolation layers of the support structure and the membranes may be arranged on top of each other in the following order, for example: the first membrane 112, the first membrane isolation layer 141, the first counter electrode element of the first stator 134, the counter electrode isolating layer of the first stator 134, the second counter electrode element of the first stator 134, the second membrane isolation layer 142, the second membrane 114, the third membrane isolation layer 143, the first counter electrode element of the second stator 138, the counter electrode isolating layer of the second stator 138, the second counter electrode element of the second stator 138, the fourth membrane isolation layer 144 and the third membrane 116.

It should be noted that while FIG. 1 shows the membrane isolation layer (e.g., the first membrane isolation layer 141) is of a vertical sidewall, for achieving high robustness, the membrane isolation layer may be a tapered sidewall. For example, the first membrane isolation layer 141 may be of a tapered sidewall oriented in a first direction. The second membrane isolation layer 142 may be of a tapered sidewall oriented in a second direction. The first direction and the second direction are opposite to each other.

After having the support structure shown in FIG. 1, each membrane (e.g., first membrane 112) comprises a movable portion and a fixed portion. The fixed portion of the first membrane 112 is, for example, mechanically connected to the support substrate 102 and the first membrane isolation layer 141.

FIG. 1 shows the triple-membrane MEMS microphone wo at its rest position, e.g. when no sound wave arrives at the membranes. The sound wave could cause the membranes 112, 114 and 116 to be deflected. As shown in FIG. 1, the third membrane 116 may be exposed to an ambient pressure and potentially a sound pressure. This top side of the third membrane 116 may also be regarded as a sound receiving main surface of the triple-membrane MEMS microphone 100. Alternatively, the first membrane 112 may be exposed to an ambient pressure and potentially a sound pressure. This bottom side of the first membrane 112 may also be regarded as a sound receiving main surface of the triple-membrane MEMS microphone 100.

In some embodiments, when sound waves are incident on the membranes (e.g., the top side of the third membrane 116), the membranes may deflect and/or oscillate. A displacement of one membrane (e.g., the third membrane 116) may result in the corresponding displacements of the second membrane 114 and the first membrane 112 if they are mechanically coupled to each other. The third membrane 116 may deflect in a direction substantially toward the second stator 138 while the second membrane 114 may simultaneously be deflected in substantially the same direction as the third membrane 116 and therefore may move away from the second stator 138. Likewise, the second membrane 114 may deflect in a direction substantially toward the first stator 134 while the first membrane 112 may simultaneously be deflected in substantially the same direction as the second membrane 114 and therefore may move away from the first stator 134.

In some embodiments, the top side of the third membrane 116 at which the sound may arrive, the total pressure may be equal to the sum of the normal pressure (e.g., the atmospheric pressure) and the sound pressure. Within the backside cavity 104, only the normal atmospheric pressure may be present.

In some embodiments, the first membrane 112 and the first stator 134 form a first capacitor. The first stator 134 and the second membrane 114 form a second capacitor. The second membrane 114 and the second stator 138 form a third capacitor. The second stator 138 and the third membrane 116 form a fourth capacitor.

It should be noted that the capacitor arrangement (first, second, third and fourth capacitors) described above is merely an example, which should not unduly limit the scope of the claims. One of ordinary skill in the art would recognize many variations, alternatives, and modifications. For example, the first membrane 112 and the third membrane 116 could be made of a non-conductive material and be used essentially to provide robustness against electrical leakage. The first membrane 112 and the third membrane 116 could be designed so as to satisfy the membrane compliance requirement. Under such a capacitor arrangement, the first membrane 112 and the third membrane 116 would not form capacitors with the corresponding stators, and only the second membrane 114 would form a capacitor or two capacitors with one or two stators, which would then work like a standard single backplate microphone or like a dual backplate microphone.

In operation, the capacitance variations of the four capacitors are observed. A first capacitance variation is based on the first capacitor, which is formed between the first membrane 112 and the first stator 134. A second capacitance variation is based on the second capacitor, which is formed between the first stator 134 and the second membrane 116. A third capacitance variation is based on the third capacitor, which is formed between the second membrane 114 and the second stator 138. A fourth capacitance variation is based on the fourth capacitor, which is formed between the second stator 138 and the third membrane 116. The capacitances of these four capacitors vary in relation to the movement of the movable portions of the first, second and third membranes 112, 114 and 116 with respect to the stators 134 and 138. The movement of the movable portions of the membranes 112, 114 and 116 is generated by, for example, sound pressure changes caused by speech, music and the like.

Figure 2:
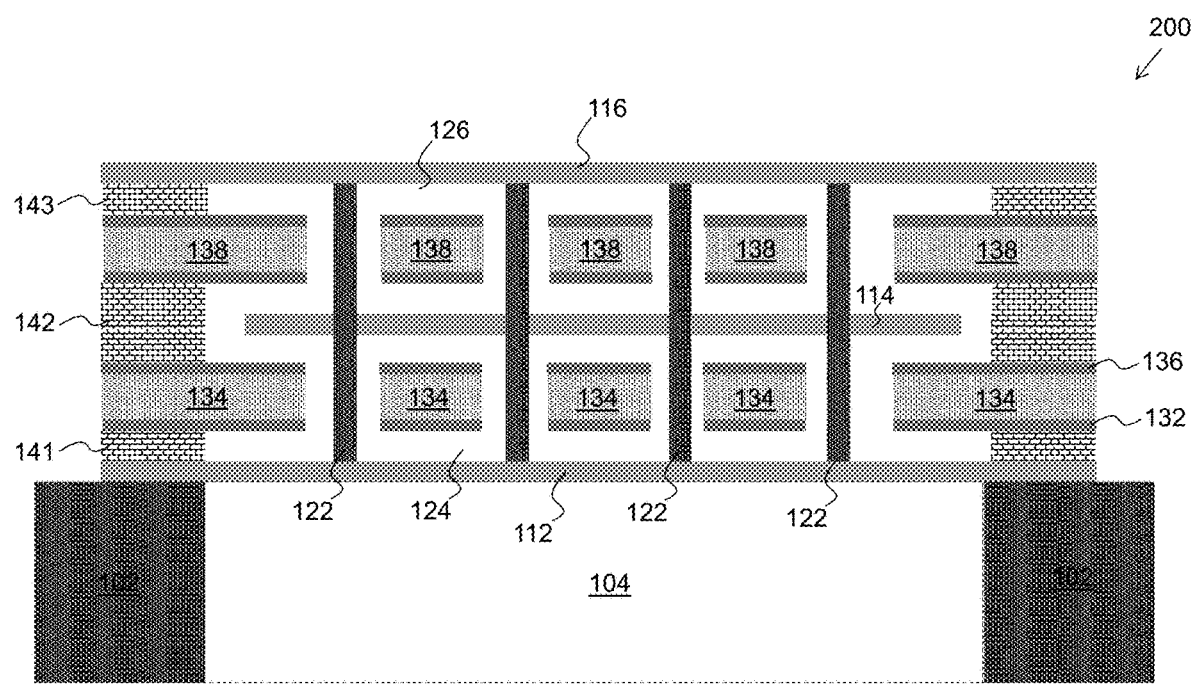
FIG. 2 illustrates a cross sectional view of a second implementation of the triple-membrane MEMS microphone in accordance with various embodiments of the present disclosure.

FIG. 2 illustrates a cross sectional view of a second implementation of the triple-membrane MEMS microphone in accordance with various embodiments of the present disclosure. The triple-membrane MEMS microphone 200 shown in FIG. 2 is similar to the triple-membrane MEMS microphone wo shown in FIG. 1 except that the peripheral portion of the second membrane 114 is not in contact with the support structure. As shown in FIG. 2, the second membrane 114 is smaller than the first membrane 112 and the third membrane 116. The second membrane 114 is mechanically coupled to the first membrane 112 and the third membrane 116 through the plurality of pillars 122.

The support structure of the triple-membrane MEMS microphone 200 shown in FIG. 2 includes the support substrate 102, the first membrane isolation layer 141, the second membrane isolation layer 142 and the third membrane isolation layer 143. In some embodiments, the peripheral portions of the first membrane 112, the third membrane 116, the stator 134 and the stator 138 may be in contact with the support structure as shown in FIG. 2. In particular, FIG. 2 shows the various membrane isolation layers of the support structure and the membranes may be arranged on top of each other in the following order, for example: the first membrane 112, the first membrane isolation layer 141, the first counter electrode element of the first stator 134, the counter electrode isolating layer of the first stator 134, the second counter electrode element of the first stator 134, the second membrane isolation layer 142, the first counter electrode element of the second stator 138, the counter electrode isolating layer of the second stator 138, the second counter electrode element of the second stator 138, the third membrane isolation layer 143 and the third membrane 116.

Figure 3:
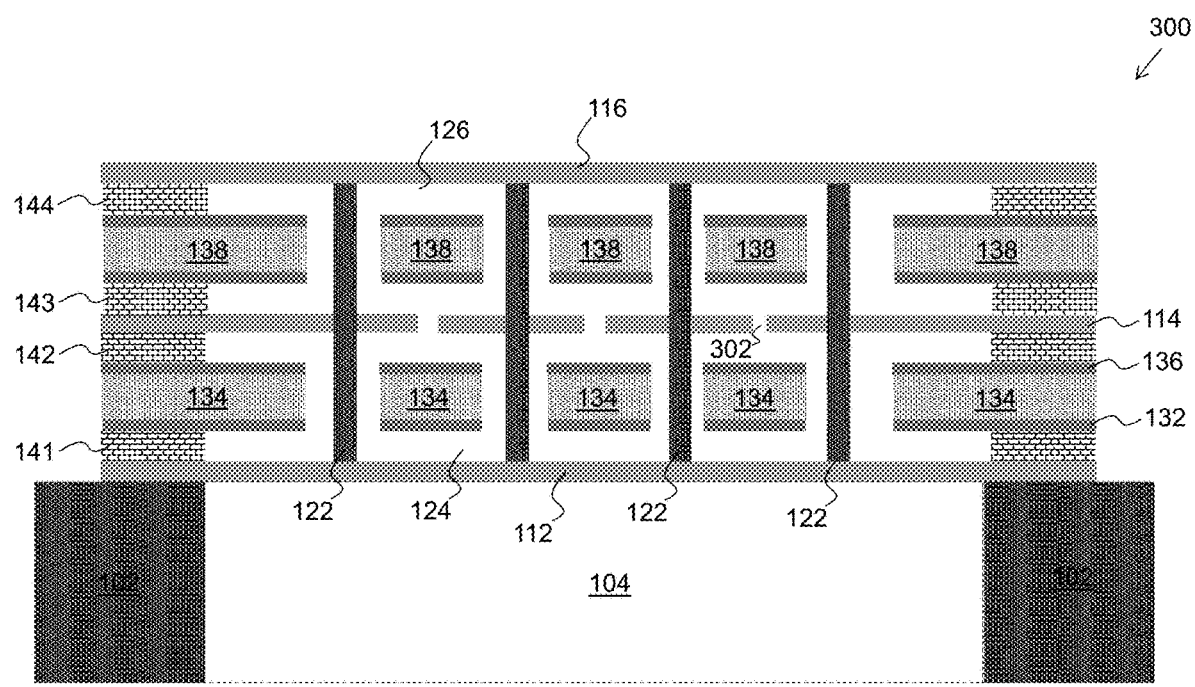
FIG. 3 illustrates a cross sectional view of a third implementation of the triple-membrane MEMS microphone in accordance with various embodiments of the present disclosure.

FIG. 3 illustrates a cross sectional view of a third implementation of the triple-membrane MEMS microphone in accordance with various embodiments of the present disclosure. The triple-membrane MEMS microphone 300 shown in FIG. 3 is similar to the triple-membrane MEMS microphone 100 shown in FIG. 1 except that the second membrane 114 has a plurality of openings 302. The plurality of openings 302 of the second membrane 114 forms perforation holes (not shown but illustrated in FIG. 5). The perforation holes are configured to facilitate a releasing process after an etching process is applied to the triple-membrane MEMS microphone 300.

Figure 4:
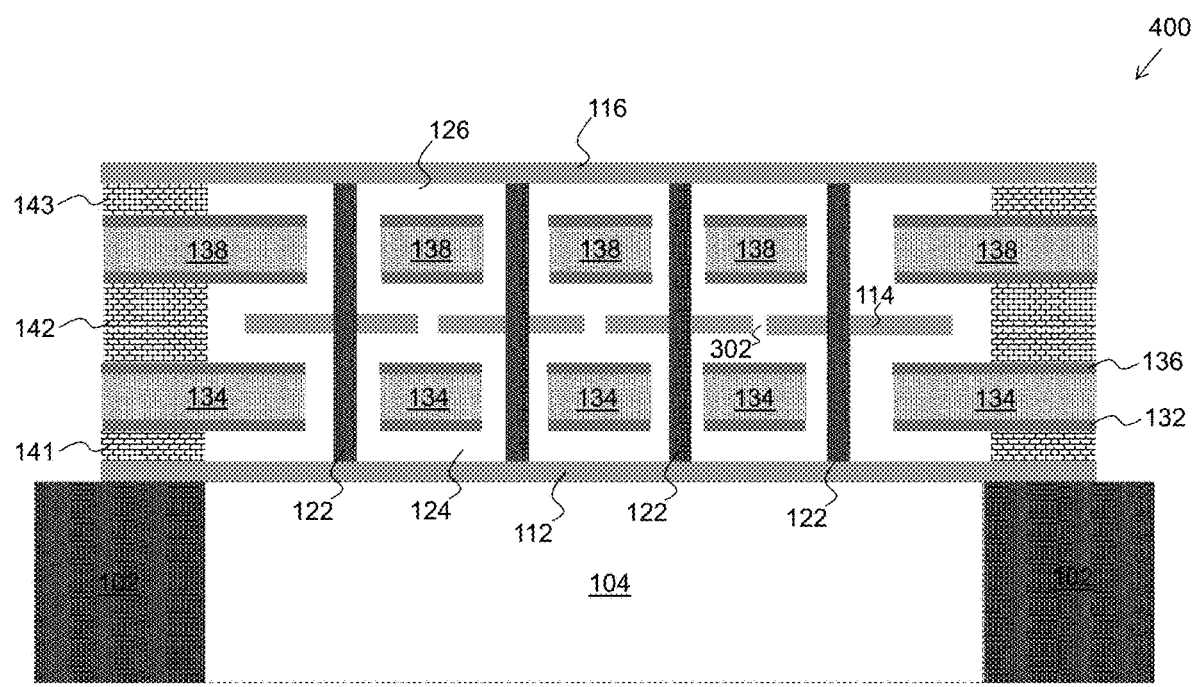
FIG. 4 illustrates a cross sectional view of a fourth implementation of the triple-membrane MEMS microphone in accordance with various embodiments of the present disclosure.

FIG. 4 illustrates a cross sectional view of a fourth implementation of the triple-membrane MEMS microphone in accordance with various embodiments of the present disclosure. The triple-membrane MEMS microphone 400 shown in FIG. 4 is similar to the triple-membrane MEMS microphone 200 shown in FIG. 2 except that the second membrane 114 has a plurality of openings 302. The plurality of openings 302 of the second membrane 114 forms perforation holes (not shown but illustrated in FIG. 5). The perforation holes are configured to facilitate a releasing process after an etching process is applied to the triple-membrane MEMS microphone 400.

Figure 5:
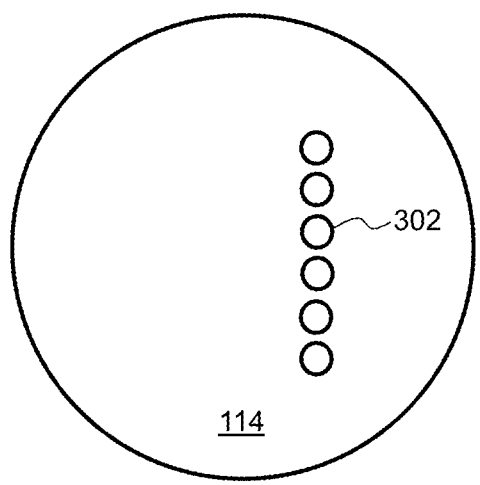
FIG. 5 illustrates a top view of the second membrane shown in FIGS. 2 and 4 in accordance with various embodiments of the present disclosure.

FIG. 5 illustrates a top view of the second membrane shown in FIGS. 2 and 4 in accordance with various embodiments of the present disclosure. In some embodiments, the second membrane 114 is substantially circular in shape by way of example. It is within the scope and spirit of the disclosure for the second membrane 114 to comprise other shapes, such as, but not limited to oval, square, rectangular and the like.

The plurality of openings 302 of the second membrane 114 forms perforation holes as shown in FIG. 5. It should be noted while FIG. 5 shows the plurality of openings 303 is aligned with each other to form a straight dotted line, this is merely an example, which should not unduly limit the scope of the claims. One of ordinary skill in the art would recognize many variations, alternatives, and modifications.

Figure 6:
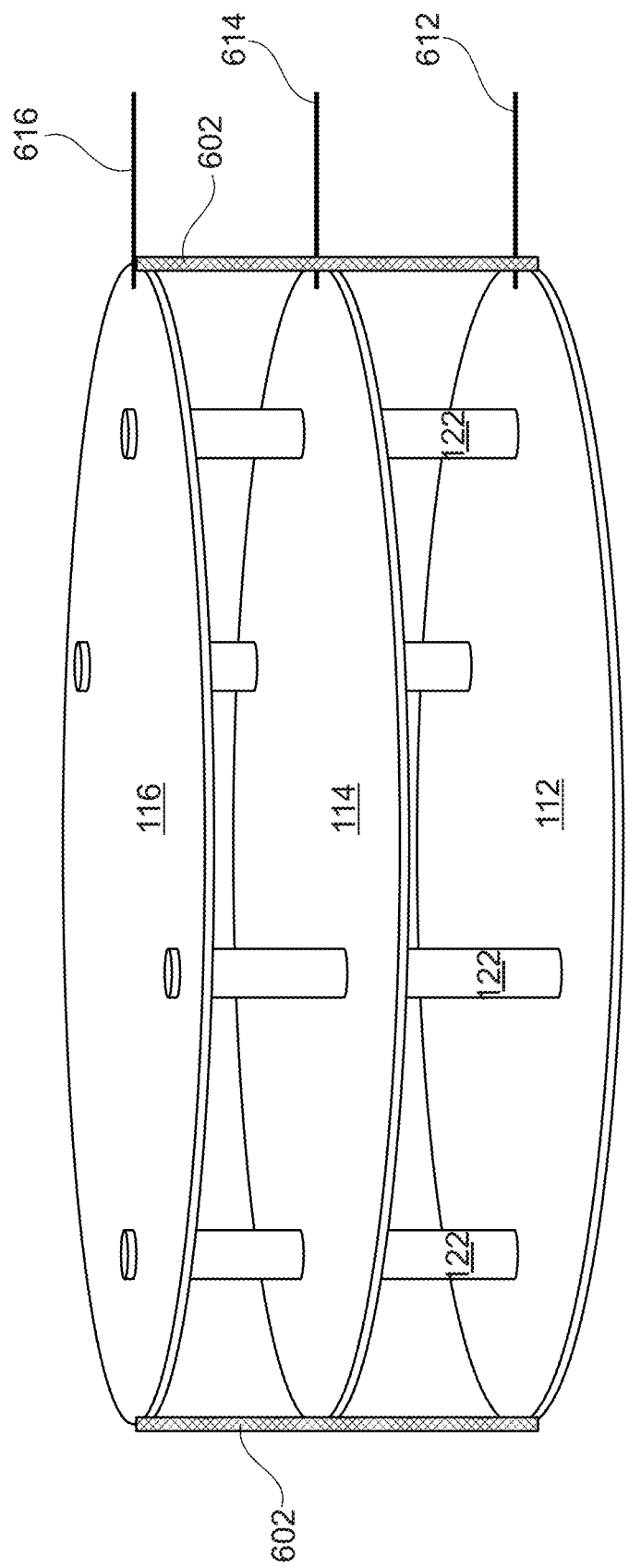
FIG. 6 illustrates a perspective view of the first implementation of the triple-membrane MEMS microphone shown in FIG. 1 in accordance with various embodiments of the present disclosure.
Figure 7:
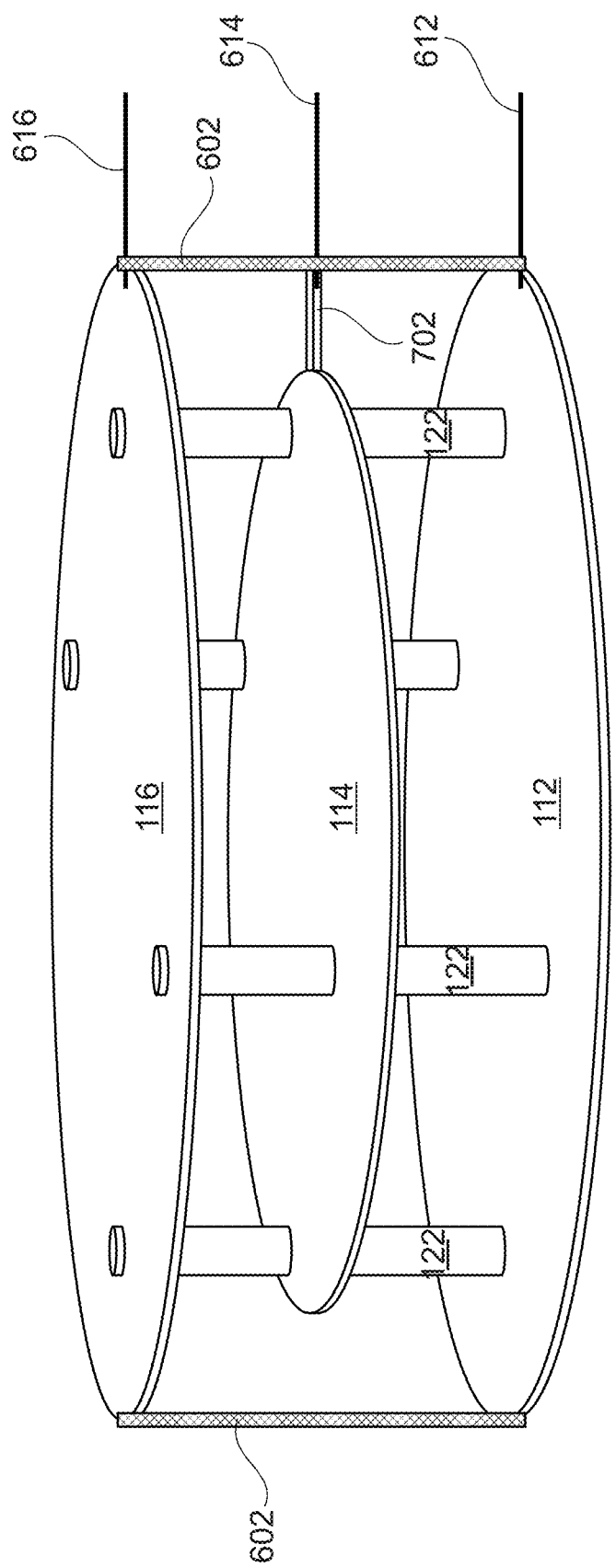
FIG. 7 illustrates a perspective view of the second implementation of the triple-membrane MEMS microphone shown in FIG. 2 in accordance with various embodiments of the present disclosure.
Figure 8:
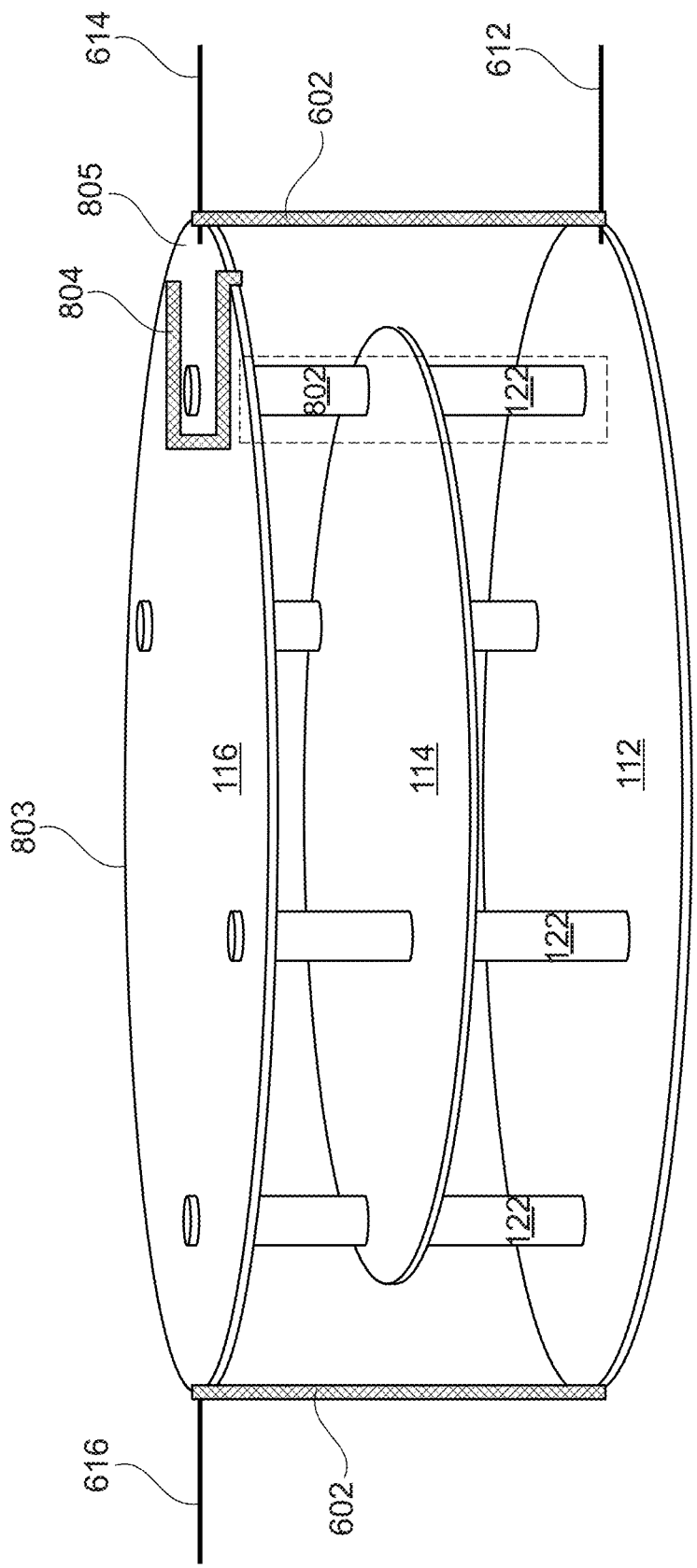
FIG. 8 illustrates another perspective view of the second implementation of the triple-membrane MEMS microphone shown in FIG. 2 in accordance with various embodiments of the present disclosure.

FIGS. 6-8 below illustrate perspective views of various implementations of the triple-membrane MEMS microphone in accordance with various embodiments of the present disclosure. For simplicity, the stators 134 and 138 of the triple-membrane MEMS microphone are not included in the perspective views shown in FIGS. 6-8.

FIG. 6 illustrates a perspective view of the first implementation of the triple-membrane MEMS phone shown in FIG. 1 in accordance with various embodiments of the present disclosure. The first membrane 112, the second membrane 114 and the third membrane 116 spaced apart from one another. As shown in FIG. 6, the second membrane 114 is between the first membrane 112 and the third membrane 116. The plurality of pillars 122 extends from the first membrane 112 to the third membrane 116. The plurality of pillars 122 extends through the second membrane 114.

In some embodiments, the plurality of pillars 122 is formed of non-conductive materials. Furthermore, at least one pillar of the plurality of pillars 122 is mechanically coupled to the first membrane 112, the second membrane 114 and the third membrane 116. The first membrane 112, the second membrane 114 and the third membrane 116 are supported around the circumference by a support structure 602. In some embodiments, the support structure 602 is implemented as the membrane isolation layers 141-144 shown in FIG. 1.

In some embodiments, the membranes 112, 114 and 116 are deflected in response to a pressure change caused by the sound wave. Electrical signals may be generated by the deflection of the membranes 112, 114 and 116. The electrical signals may be read out by a plurality of read-out circuits. The read-out circuits process the electrical signals and convert the electrical signals into useable information.

As shown in FIG. 6, the first membrane 112 is read out through a first read-out connection terminal 612. The first read-out connection terminal 612 may be connected to any position of the circumference of the first membrane 112. Likewise, the second membrane 114 is read out through a second read-out connection terminal 614. The second read-out connection terminal 614 may be connected to any position of the circumference of the second membrane 114. The third membrane 116 is read out through a third read-out connection terminal 616. The third read-out connection terminal 616 may be connected to any position of the circumference of the third membrane 116.

FIG. 7 illustrates a perspective view of the second implementation of the triple-membrane MEMS phone shown in FIG. 2 in accordance with various embodiments of the present disclosure. The second implementation of the triple-membrane MEMS microphone shown in FIG. 7 is similar to the first implementation of the triple-membrane MEMS microphone shown in FIG. 6 except that the second membrane 114 is a free-standing element. More particularly, the outer peripheral portion of the main portion of the second membrane 114 is not in contact with the support structure 602. As shown in FIG. 7, the second membrane 114 is smaller than the first membrane 112 and the third membrane 116. The second membrane 114 is mechanically coupled to the first membrane 112 and the third membrane 116 through the plurality of pillars 122.

The read-out connections of the first membrane 112 and the third membrane 116 are similar to those shown in FIG. 6, and hence are not discussed again herein. The second membrane 114 comprises a main portion and a panhandle portion. As shown in FIG. 7, the panhandle portion of the second membrane 114 is a protruding structure extending from the main portion of the second membrane 114. The main portion of the second membrane 114 is connected to a read-out circuit through the panhandle portion.

In some embodiments, the main portion of the second membrane 114 is circular in shape. The panhandle portion of the second membrane 114 is rectangular in shape. This shape of the panhandle portion of the second membrane 114 is merely an example, which should not unduly limit the scope of the claims. One of ordinary skill in the art would recognize many variations, alternatives, and modifications. For example, the panhandle portion of the second membrane 114 can be any other appropriate shape, such as square, round, oval, any combinations thereof and the like.

FIG. 8 illustrates another perspective view of the second implementation of the triple-membrane MEMS phone shown in FIG. 2 in accordance with various embodiments of the present disclosure. The triple-membrane MEMS microphone shown in FIG. 8 is similar to the triple-membrane MEMS device shown in FIG. 7 except that at least one pillar is configured to provide an electrical coupling between two membranes.

As shown in FIG. 8, the pillar 122 in the dashed rectangle includes two portions. A lower portion is placed between the first membrane 112 and the second membrane 114. An upper portion 802 is placed between the second membrane 114 and the third membrane 116. A middle point of the pillar 122 is mechanically coupled to the second membrane 114. The middle point is the interface between the lower portion and the upper portion.

In some embodiments, the lower portion of the pillar 122 is formed of a non-conductive material. The lower portion of the pillar 122 is a non-conductive portion. The upper portion 802 is formed of a conductive material. The upper portion of the pillar 122 is a conductive portion. The conductive upper portion 802 is configured to electrically couple two membranes. In particular, the conductive upper portion 802 provides an electrical path between the second membrane 114 and the third membrane 116.

The third membrane 116 is divided into two electrically isolating portions by an insulating structure 804. The insulating structure 804 is formed of any suitable dielectric materials.

As shown in FIG. 8, a first portion 803 of the third membrane 116 is read out by the third read-out connection terminal 616. The second membrane 114 is read out by the second read-out connection terminal 614 through the electrical path formed by the upper portion 802 and a second portion 805 of the third membrane 116. As such, signals generated by the MEMS microphone are configured to flow between the second membrane 114 and the third membrane 116 through the upper portion 802 of the pillar 122.

It should be noted that the connection shown in FIG. 8 is merely an example, which should not unduly limit the scope of the claims. One of ordinary skill in the art would recognize many variations, alternatives, and modifications. For example, the lower portion of the pillar 122 may be formed of a conductive material. The upper portion of the pillar 122 may be formed of a non-conductive material. The conductive lower portion is configured to electrically couple two membranes. In particular, the conductive lower portion provides an electrical path between the second membrane 114 and the first membrane 112.

Figure 9:
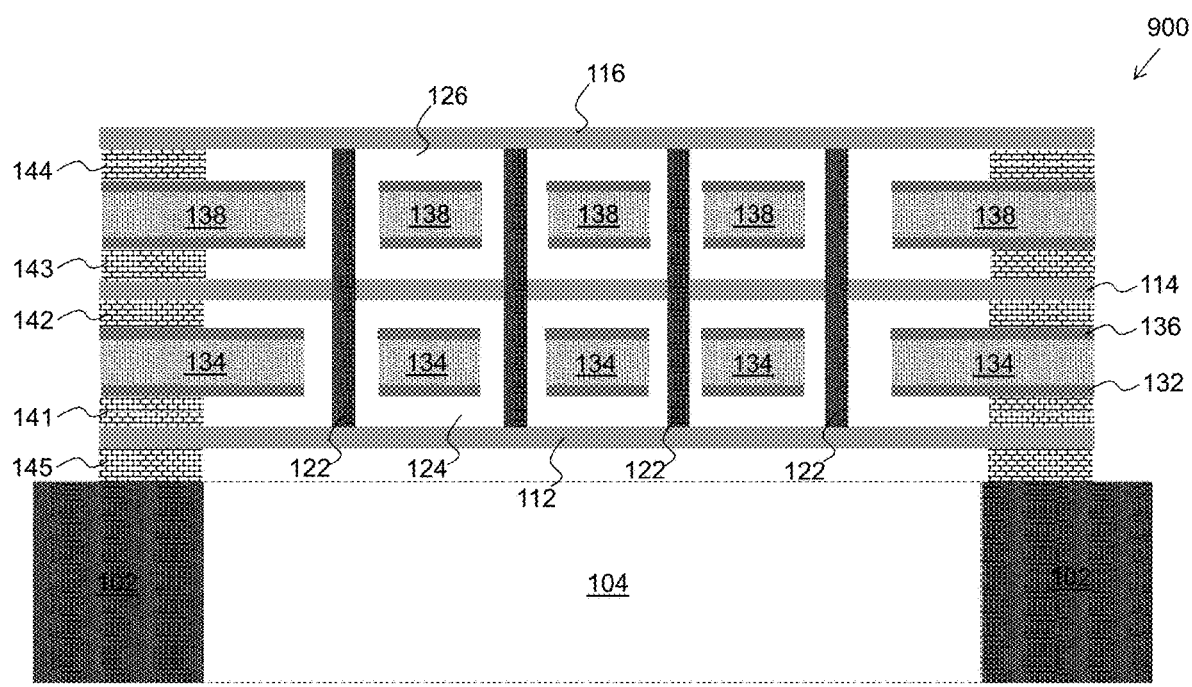
FIG. 9 illustrates a cross sectional view of a fifth implementation of the triple-membrane MEMS microphone in accordance with various embodiments of the present disclosure.

FIG. 9 illustrates a cross sectional view of a fifth implementation of the triple-membrane MEMS microphone in accordance with various embodiments of the present disclosure. The triple-membrane MEMS microphone 900 shown in FIG. 9 is similar to the triple-membrane MEMS microphone 100 shown in FIG. 1 except that the first membrane 112 is not in direct contact with the support substrate 102. As shown in FIG. 9, a membrane isolation layer 145 is placed between the first membrane 112 and the support substrate 102.

It should be noted that depending on design needs, the additional membrane isolation layer 145 may be implemented in other implementations of the triple-membrane MEMS microphone shown in FIGS. 2-4.

Embodiments of the present invention are summarized here. Other embodiments can also be understood from the entirety of the specification and the claims filed herein.

Example 1. A microelectromechanical system (MEMS) apparatus comprising: a first membrane, a second membrane and a third membrane spaced apart from one another, wherein the second membrane is between the first membrane and the third membrane, a first low pressure region between the first membrane and the second membrane, a second low pressure region between the second membrane and third second membrane, a first stator in the first low pressure region, and a second stator in the second low pressure region.

Example 2. The MEMS apparatus of example 1, where each of the first stator and the second stator comprises a first counter electrode element and a second counter electrode element spaced apart from each other by a counter electrode isolating layer.

Example 3. The MEMS apparatus of one of examples 1 and 2, where the first low pressure region and the second low pressure region have a pressure less than an outer pressure.

Example 4. The MEMS apparatus of example 3, where the pressure of the first low pressure region and the second low pressure region is substantially a vacuum.

Example 5. The MEMS apparatus of one of examples 1 to 4, where the first low pressure region and the second low pressure region are within a sealed chamber, and wherein the sealed chamber is formed between the first membrane and the third membrane.

Example 6. The MEMS apparatus of one of examples 1 to 5, where the second membrane comprises a main portion and a panhandle portion, and wherein the main portion of the second membrane is connected to a read-out circuit through the panhandle portion.

Example 7. The MEMS apparatus of example 6, where the main portion of the second membrane is circular in shape, and the panhandle portion of the second membrane is a protruding structure extending from the main portion of the second membrane.

Example 8. The MEMS apparatus of one of examples 1 to 7, further comprising: a plurality of pillars mechanically coupled to the first membrane, the second membrane and the third membrane, where at least one pillar of the plurality of pillar has a first terminal coupled to the first membrane, a second terminal coupled to the third membrane and a middle point coupled to the second membrane, and wherein at least one portion of the at least one pillar is a conductive portion being configured to electrically couple two membranes.

Example 9. The MEMS apparatus of example 8, where the at least one pillar comprises a first portion coupled between the first membrane and the second membrane, and a second portion coupled between the second membrane and the third membrane, and wherein the first portion of the at least one pillar is formed of a non-conductive material, and the second portion of the at least one pillar is formed of a conductive material, and wherein signals generated by the MEMS apparatus are configured to flow between the second membrane and the third membrane through the second portion of the at least one pillar.

Example 10. The MEMS apparatus of one of examples 1 to 9, where the second membrane comprises a plurality of openings, and wherein the plurality of openings of the second membrane forms perforation holes.

Example 11. The MEMS apparatus of one of examples 1 to 10, where the first membrane and the first stator form a first capacitor, the first stator and the second membrane form a second capacitor, the second membrane and the second stator form a third capacitor, and the second stator and the third membrane form a fourth capacitor.

Example 12. The MEMS apparatus of one of examples 1 to 5, where the MEMS apparatus is a MEMS microphone.

Example 13. A triple-membrane MEMS device comprising: a first membrane, a second membrane and a third membrane spaced apart from one another, wherein the second membrane is between the first membrane and the third membrane, and the second membrane comprises a plurality of openings, a sealed low pressure chamber between the first membrane and the third membrane, and a plurality of electrodes in the sealed low pressure chamber.

Example 14. The triple-membrane MEMS device of example 13, further comprising: at least one pillar in the sealed low pressure chamber, the at least one pillar being mechanically coupled to the first membrane, the second membrane and the third membrane.

Example 15. The triple-membrane MEMS device of one of examples 13 and 14, where the at least one pillar is configured to provide an electrical coupling between two membranes.

Example 16. The triple-membrane MEMS device of one of examples 13 and 14, where the at least one pillar comprises a non-conductive portion coupled between the first membrane and the second membrane, and a conductive portion coupled between the second membrane and the third membrane, and wherein the first membrane is isolated from the second membrane, and the second membrane is electrically coupled to the third membrane.

Example 17. The triple-membrane MEMS device of example 16, where the second membrane is electrically coupled to the third membrane through the at least one pillar.

Example 18. The triple-membrane MEMS device of one of examples 13 to 17, where the second membrane comprises a main portion circular in shape and a panhandle portion, and wherein the main portion of the second membrane is electrically connected to a read-out circuit through the panhandle portion.

Example 19. The triple-membrane MEMS device of one of examples 13 to 18, where the plurality of openings of the second membrane forms perforation holes.

Example 20. The triple-membrane MEMS device of example 19, where the perforation holes are configured to facilitate a releasing process after an etching process is applied to the triple-membrane MEMS device.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A microelectromechanical system (MEMS) apparatus comprising:
a first membrane, a second membrane and a third membrane spaced apart from one another, wherein the second membrane is between the first membrane and the third membrane;
a first low pressure region between the first membrane and the second membrane;
a second low pressure region between the second membrane and the third membrane;
a first stator in the first low pressure region;
a second stator in the second low pressure region; and
a plurality of pillars mechanically coupled to the first membrane, the second membrane and the third membrane, wherein at least one pillar of the plurality of pillars has a first terminal coupled to the first membrane, a second terminal coupled to the third membrane and a middle point coupled to the second membrane, and wherein at least one portion of the at least one pillar is a conductive portion being configured to electrically couple two membranes.

2. The MEMS apparatus of claim 1, wherein:
each of the first stator and the second stator comprises a first counter electrode element and a second counter electrode element spaced apart from each other by a counter electrode isolating layer.

3. The MEMS apparatus of claim 1, wherein:
the first low pressure region and the second low pressure region have a pressure less than an outer pressure.

4. The MEMS apparatus of claim 3, wherein:
the pressure of the first low pressure region and the second low pressure region is substantially a vacuum.

5. The MEMS apparatus of claim 1, wherein:
the first low pressure region and the second low pressure region are within a sealed chamber, and wherein the sealed chamber is formed between the first membrane and the third membrane.

6. The MEMS apparatus of claim 1, wherein:
the second membrane comprises a main portion and a panhandle portion, and wherein the main portion of the second membrane is connected to a read-out circuit through the panhandle portion.

7. The MEMS apparatus of claim 6, wherein:
the main portion of the second membrane is circular in shape; and
the panhandle portion of the second membrane is a protruding structure extending from the main portion of the second membrane.

8. The MEMS apparatus of claim 1, wherein:
the at least one pillar comprises a first portion coupled between the first membrane and the second membrane, and a second portion coupled between the second membrane and the third membrane, and wherein the first portion of the at least one pillar is formed of a non-conductive material, and the second portion of the at least one pillar is formed of a conductive material, and wherein signals generated by the MEMS apparatus are configured to flow between the second membrane and the third membrane through the second portion of the at least one pillar.

9. The MEMS apparatus of claim 1, wherein the second membrane comprises a plurality of openings, and wherein the plurality of openings of the second membrane forms perforation holes.

10. The MEMS apparatus of claim 1, wherein:
the first membrane and the first stator form a first capacitor;
the first stator and the second membrane form a second capacitor;
the second membrane and the second stator form a third capacitor; and
the second stator and the third membrane form a fourth capacitor.

11. The MEMS apparatus of claim 1, wherein:
the MEMS apparatus is a MEMS microphone.

12. A triple-membrane MEMS device comprising:
a first membrane, a second membrane and a third membrane spaced apart from one another, wherein the second membrane is between the first membrane and the third membrane, and the second membrane comprises a plurality of openings;
a sealed low pressure chamber between the first membrane and the third membrane;
a plurality of electrodes in the sealed low pressure chamber; and
at least one pillar in the sealed low pressure chamber, the at least one pillar being mechanically coupled to the first membrane, the second membrane and the third membrane, wherein the at least one pillar comprises a non-conductive portion coupled between the first membrane and the second membrane, and a conductive portion coupled between the second membrane and the third membrane, and wherein the first membrane is isolated from the second membrane, and the second membrane is electrically coupled to the third membrane.

13. The triple-membrane MEMS device of claim 12, wherein:
the at least one pillar is configured to provide an electrical coupling between two membranes.

14. The triple-membrane MEMS device of claim 12, wherein:
the second membrane is electrically coupled to the third membrane through the at least one pillar.

15. The triple-membrane MEMS device of claim 12, wherein:
the second membrane comprises a main portion circular in shape and a panhandle portion, and wherein the main portion of the second membrane is electrically connected to a read-out circuit through the panhandle portion.

16. The triple-membrane MEMS device of claim 12, wherein:
the plurality of openings of the second membrane forms perforation holes.

17. The triple-membrane MEMS device of claim 16, wherein:
the perforation holes are configured to facilitate a releasing process after an etching process is applied to the triple-membrane MEMS device.

18. A microelectromechanical system (MEMS) apparatus comprising:
a first membrane, a second membrane and a third membrane spaced apart from one another, wherein the second membrane is between the first membrane and the third membrane;
a first low pressure region between the first membrane and the second membrane;
a second low pressure region between the second membrane and the third membrane;
a first stator in the first low pressure region; and
a second stator in the second low pressure region, wherein the second membrane comprises a main portion and a panhandle portion, and wherein the main portion of the second membrane is connected to a read-out circuit through the panhandle portion.

19. The MEMS apparatus of claim 18, wherein:
the main portion of the second membrane is circular in shape; and
the panhandle portion of the second membrane is a protruding structure extending from the main portion of the second membrane.

20. The MEMS apparatus of claim 18, wherein the second membrane comprises a plurality of openings, and wherein the plurality of openings of the second membrane forms perforation holes.

* * * * *